United States Patent
Lowitz et al.

(10) Patent No.: US 6,598,182 B1
(45) Date of Patent: Jul. 22, 2003

(54) ELECTROMIGRATION AND EXTRUSION MONITOR AND CONTROL SYSTEM

(75) Inventors: Nicholas J. Lowitz, Poughkeepsie, NY (US); Charles J. Montrose, Clintondale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,352

(22) Filed: Sep. 29, 1999

(51) Int. Cl.[7] .................................................. H02H 3/05
(52) U.S. Cl. ............................. 714/39; 361/56; 363/97; 369/27; 324/703
(58) Field of Search .............................. 714/39, 41, 51; 363/74, 78, 97; 324/551, 763, 703, 715, 716, 718, 719; 361/55, 56, 57, 79, 78, 5, 6; 369/27

(56) References Cited

U.S. PATENT DOCUMENTS

| | | | | |
|---|---|---|---|---|
| 5,030,905 A | * | 7/1991 | Figal | 324/760 |
| 5,568,054 A | * | 10/1996 | Iino et al. | 324/537 |
| 5,760,595 A | * | 6/1998 | Edwards et al. | 219/209 |
| 6,037,795 A | * | 3/2000 | Filippi et al. | 324/158.1 |
| 6,043,702 A | * | 3/2000 | Singh | 326/27 |
| 6,054,865 A | * | 4/2000 | Bald et al. | 324/545 |
| 6,118,639 A | * | 9/2000 | Goldstein | 361/55 |

* cited by examiner

Primary Examiner—Robert Beausoliel
Assistant Examiner—Rita A Ziemer
(74) Attorney, Agent, or Firm—RatnerPrestia; Tiffany L. Townsend, Esq.

(57) ABSTRACT

A system for stressing and monitoring an electrical device, such that the imposed stress conditions may be terminated at electronic speeds, thereby preventing destruction of the device under test. The system includes stress channels each paired with a control and monitor circuit, such that the control and monitor circuit may shut down the stress if a limiting stress level is detected by the control and monitor circuit. A microprocessor is used to communicate via a digital control bus with each of the paired stress channels and control and monitor circuits to determine the status of the stress channel; control the stress input; and enable or disable the control and monitor circuits. A computer is used to communicate with the microprocessor through a serial interface.

29 Claims, 4 Drawing Sheets

Fig. 4

ELECTROMIGRATION AND EXTRUSION MONITOR AND CONTROL SYSTEM

TECHNICAL FIELD

The present invention relates generally to systems for monitoring and controlling stress testing of electrical circuits and devices. More particularly, the invention relates to a test system for providing a stress to electrical devices such that the stress test can be automatically shut down before destructive failure of the device under test. The system monitors the stress levels of the parts of the circuit being tested to limit, among other parameters, the electromigration and extrusion occurring within the circuit during the stress testing. The limits are implemented automatically by localized electronics and thereby reduce the potential for overstressing and destruction of the circuit being tested. The system is particularly suited to monitoring and controlling a high-temperature, constant-current stress applied to a device.

BACKGROUND OF THE INVENTION

In qualifying a new electronics technology, it is helpful and often necessary to evaluate the reliability of the technology. More particularly, evaluation of the reliability of the electrical circuits or devices is important. One aspect of the reliability testing is to evaluate the electromigration and extrusion of the circuit or device under constant current conditions.

Although the testing of the circuit is important, it is also valuable to be able to physically analyze the structure of the circuit after the stress test to obtain an understanding of how the structure was altered as a result of the stress imposed. A problem with the testing and stressing of a circuit is the potential for overstressing the structure. When such overstressing occurs, and because of the speed at which such stresses affect the device, the structure is often destroyed, making analysis of the stress effects impossible. The destruction that occurs to a device after overstressing often occurs in very short time intervals, and thus human intervention is too slow to prevent destruction after the device reaches its stress limit.

Current techniques for testing and monitoring circuits use a computer-controlled scanner to read the status and condition of each part of the structure under stress. Typically, a constant current is applied to the structure and a voltage is applied to the extrusion monitor. As part of current testing techniques, preset limits are specified for the resistance being monitored in the structure, and the extrusion monitor current is not limited in any manner. When the computer observes, through the scanner, that the resistance of the structure has increased above the preset limit, or that the extrusion monitor has begun to draw current above the preset limit, a stop-stress-test signal is sent by the computer.

Inherent time delays are associated with a computer scanner as it senses limit states. Additional delays occur during the time the computer takes to respond to such conditions. Therefore, the stop-stress-test signal often occurs after the device under test has already been destroyed. As noted, the destruction of a device may occur at electronic speeds.

Moreover, the conventional hardware available and used for such qualification testing is often selected for use with sampling plans and factory statistical analyses. As part of sampling plans and factory statistical analyses, there is generally no need for testing the failure characteristics of a stressed device. Therefore, current stress and monitor equipment is not designed to react in the necessary time intervals to prevent destruction.

Accordingly, there remains a need for a stress and monitor system to allow stress testing of a device while monitoring the stress conditions of the device such that the testing can be stopped at electronic speeds before the device is destroyed. The stress and monitor system should be able to monitor multiple channels and have pre-selected limits for allowable stress. The system should also be capable of recording the condition and stress channel that caused the system to shut down the stress testing. With such a system, electrical devices may be qualified under stress and still be analyzed afterwards to determine how the structural mechanisms of the device under test are affected by the stress loading.

SUMMARY OF THE INVENTION

To overcome the shortcomings of the prior art, it is an object of the present invention to provide a stress and monitor system for electrically stressing an electrical device with the capability of turning the stress load off at electronic speeds such that the device under test is not destroyed. To achieve this and other objects, and in view of its purposes, the present invention provides an electrical stress and monitor system for electrically stressing an electrical device, comprising a plurality of stress channels for stressing the electrical device and a plurality of control and monitor circuits. Each of the circuits is paired with one of the plurality of stress channels, each of the circuits has a predefined limit stress level, and each of the circuits communicates with and controlling the plurality of stress channels so that, if a control and monitor circuit senses a stress level at the predefined limit stress level, the control and monitor circuit shuts down the paired stress channel.

It is a further object of the present invention to provide a high-temperature, constant-current stress and monitor system for electrically stressing an electrical circuit, comprising a plurality of stress channels; a plurality of control and monitor circuits, each of the circuits being paired with one of the plurality of stress channels and communicating with and controlling the plurality of stress channels such that, if a control and monitor circuit senses a limiting stress level, the control and monitor circuit shuts down the paired stress channel; a control bus communicating with each of the paired stress channels and control and monitor circuits; a status and enabling mechanism communicating with the paired stress channels and control and monitor circuits through the control bus, the status and enabling mechanism (1) determining the status of the stress channel, (2) controlling the stress input, and (3) enabling and disabling the control and monitor circuits; and a computer communicating with the status and enabling mechanism through a serial interface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of various features are arbitrarily expanded or reduced for clarity. Included in the drawing are the following figures.

DETAILED DESCRIPTION OF THE INVENTION

The invention will next be described with reference to the figures in which the same numbers indicate the same elements in all figures. Such figures are intended to be illustrative, rather than limiting, and are included to facilitate the explanation of the present invention. The present invention is an electrical device stress and monitor system. The stress and monitor system is capable of automatically taking off line any one or more of a plurality of stress channels when the stress in that channel reaches a preselected limit level.

Conventional Current Stress System

Figure 1:
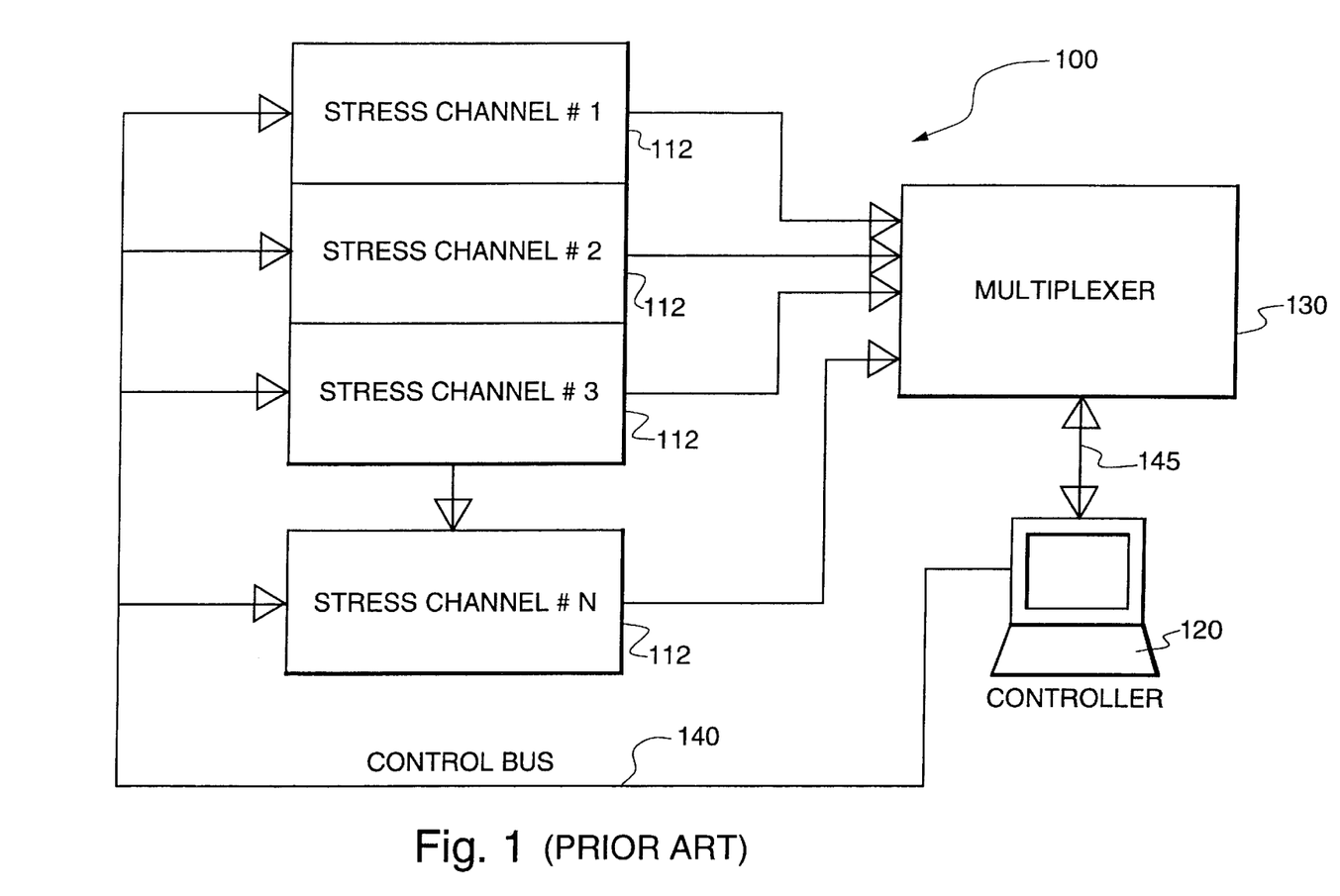
FIG. 1 shows a conventional stress and monitor system.

Conventional current stress systems, such as system 100 illustrated in FIG. 1, include a series of stress channels 112 used to impart an electrical stress to different parts or segments of a device under test. The current stress system 100 shown in FIG. 1 also includes a system controller or personal computer 120. The system controller 120, through the control bus 140, communicates with the stress channels 112. The stress testing generally includes applying a constant current to the device and applying a voltage to an extrusion monitor (not shown). A computer-controlled scanner, or multiplexer usually reads the status of each part of the device under stress. When the computer observes that the device structure resistance has increased to a preselected limit value, or when the extrusion monitor is drawing current in excess of a preselected value, the controller 120 stops the stress testing. Because a computer may take a significant period of time to scan through the multiple stress channels 112 being used, especially as compared to the response time of the measured failure event that may occur, and a similar length of time to send a stop-stress-test signal, the device may be destroyed by the time the computer has sensed and reacted to a limit stress level.

As also shown in FIG. 1, the system 100 may include a multiplexer system to readback each of the stress channels 112. Separate multiplexers 130 within the multiplexer system act as readback devices to sense analog measurements of each stress channel 112. The computer communicates with the multiplexers through an interface 145. The analog measurements read by the multiplexers and then the computer may include, without limitation, voltage and current.

Improved Current Stress System of the Present Invention

Figure 2:
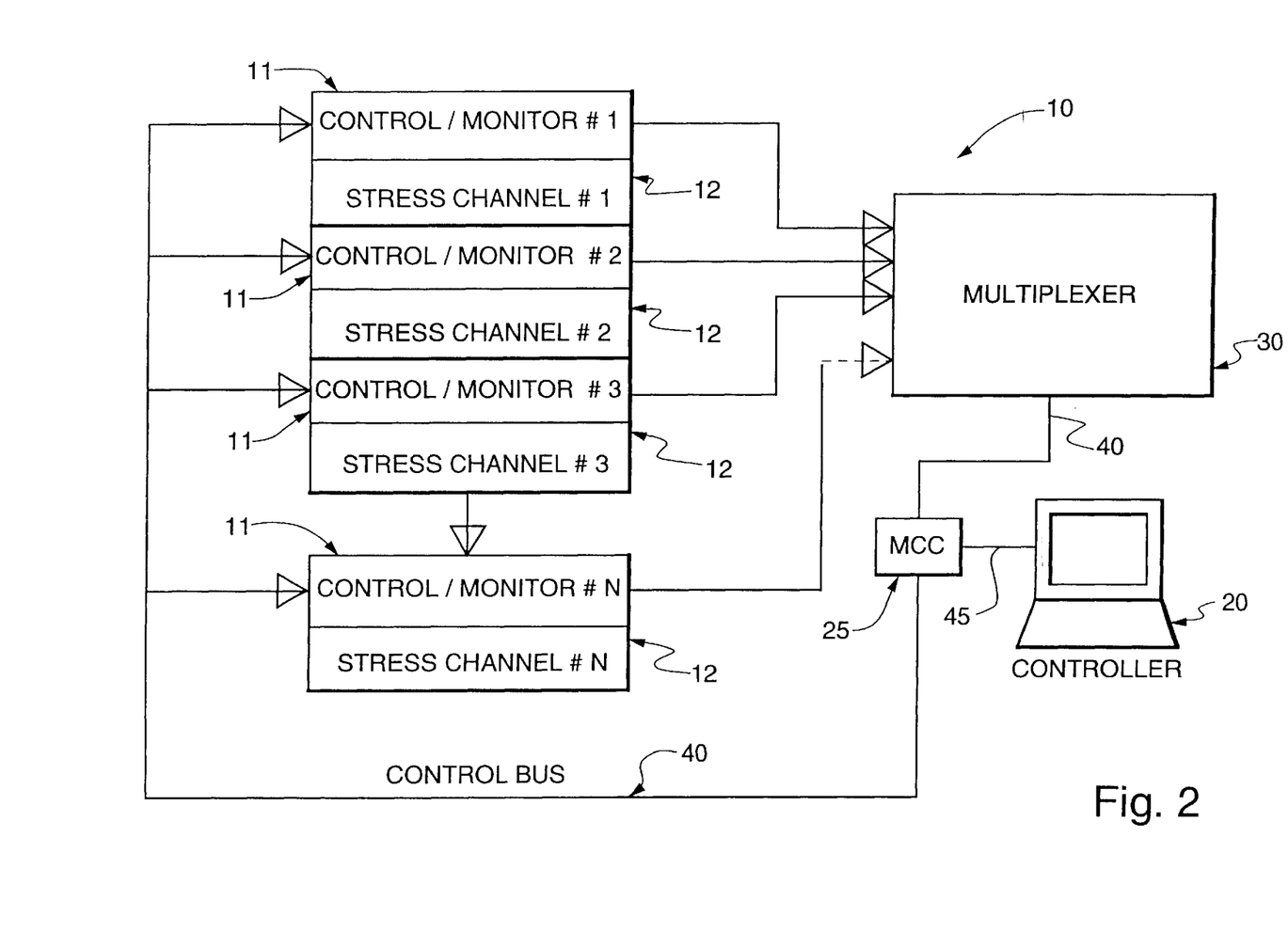
FIG. 2 shows an exemplary embodiment of the stress and monitor system of the present invention.

As illustrated in FIG. 2, the present invention is an improved stress and monitor system 10. The system 10 has several components. First, the system 10 includes a plurality of separate stress channels 12, each for imposing a stress condition to a part of the device or structure under test. Paired with each of the stress channels 12 is a control and monitor circuit 11. The control and monitor circuits 11 are each localized; the control and monitor circuits 11 are separate electronic devices that communicate with a corresponding paired stress channel 12.

The control and monitor circuits 11 are each designed with a programmable limit for allowable stress levels. In other preferred embodiments, the control and monitor circuits 11 may have programmable limit stress levels for flexible testing capability. In operation, each control and monitor circuit 11 monitors the stress level of the stress channel 12 with which it is paired, and when, or if, the stress level monitored reaches the limit level, the control and monitor circuit 11 automatically and at electronic speeds shuts down the corresponding stress channel 12.

Two types of stress, electromigration and extrusion, are generally experienced by an electrical device under load. Other stress parameters may also be experienced and monitored by the present invention such as rates of electromigration and extrusion, as well as temperature. In a preferred embodiment of the present invention, the control and monitor circuits 11 include at least one or both of an electromigration monitor and an extrusion monitor. The electromigration monitor observes when the resistance of the device under test exceeds the programmed limit. The extrusion monitor senses when an extrusion occurs in the device under test. The detailed circuit descriptions of preferred embodiments of the present invention electromigration monitor and extrusion monitor are provided below.

In a preferred embodiment of the system 10 illustrated in FIG. 2, the stress and monitor system 10 also includes a master control card 25 (MCC). The purpose of the master control card 25 is to communicate with each of the paired control and monitor circuits 11 and stress channels 12 through a control bus 40. The communication to and from the master control card 25 includes several aspects. One function of the master control card 25 is to monitor the status of the stress channels 12, that is, whether any stress channel 12 has been taken off line by the paired control and monitor circuit 11. Another function of the master control card 25 is to enable or disable one or more of the control and monitor circuits 11. The master control card 25, in another preferred embodiment, also controls the integrated multiplexers.

As such, through the master control card 25, the user has the ability to turn off one or more control and monitor circuits 11, and thereby to allow the stress and monitor system 10 to overstress the device under test or to run the stress test until the operator desires to end the test. In a preferred embodiment, the master control card 25 may be a simplified microprocessor using a low-level programming language. That is, the master control card 25 may be programmed using a low-level microcode language.

The preferred embodiment of the stress and monitor system 10 shown in FIG. 2 also includes a system controller or personal computer 20. The system controller 20, through the master control card 25, communicates with the stress channels 12 and the control and monitor circuits 11 and the multiplexers. The communication of the controller 20 to the paired stress channels 12 and the control and monitor circuits 11 includes both monitoring of status as well as control of the control and monitor circuits 11 and the multiplexers. As shown in FIG. 2, the communication path between the system controller and the master control card 25 is a serial interface 45.

In a preferred embodiment, the controller 20 allows the user to interface with the stress channels 12 and control and monitor circuits 11 using a higher-level programming language. As such, the controller 20 may be the user's interface with the stress channels 12 as well as the control and monitor circuits 11. In the preferred embodiment shown in FIG. 2, the controller 20 communicates with the stress channels 12 and the control and monitor circuits 11 through a serial interface 45 to the master control card 25. In another embodiment, however, the controller 20 may communicate directly with the stress channels 12 and the control and monitor circuits 11 without the master control card 25. The functional control and monitoring of the stress channels 12 still exists without the master control card 25 because of the localized electronics paired with each of the stress channels 12.

As also shown in FIG. 2, the system 10 may include an integrated multiplexer system comprising a plurality of multiplexers 30 to communicate with each of the control and monitor circuits 11. The communication path to the multiplexers 30 may be, as shown in FIG. 2 through a serial interface 45 to the master control card 25. The multiplexers 30 acts as a readback device to sense analog measurements of each stress channel 12. Such measurements may include, without limitation, voltage and current. Through the use of integrated multiplexers 30, the need for extensive and often cumbersome external scanning equipment is obviated.

As noted, in a preferred embodiment, the system 10 includes control and monitor circuits 11 for electromigration and extrusion. The details of a preferred embodiment of electromigration and extrusion control and monitor circuits 11 are described below. Although electromigration and extrusion are two primary stress symptoms experienced by devices under test, it is to be understood that other parameters may also be monitored and used as a basis for control of a stress channel 12. Such other parameters may include, without limitation, rate of electromigration, rate of extrusion, and temperature of a stressed part of a device under test. Such parameters would be controlled and monitored through control and monitor circuits 11 as illustrated in FIG. 2. For purposes of illustration and without limitation, examples of detailed circuits for electromigration and extrusion monitors are described.

Preferred Embodiment of Electromigration Control and Monitor Circuit

Figure 3:
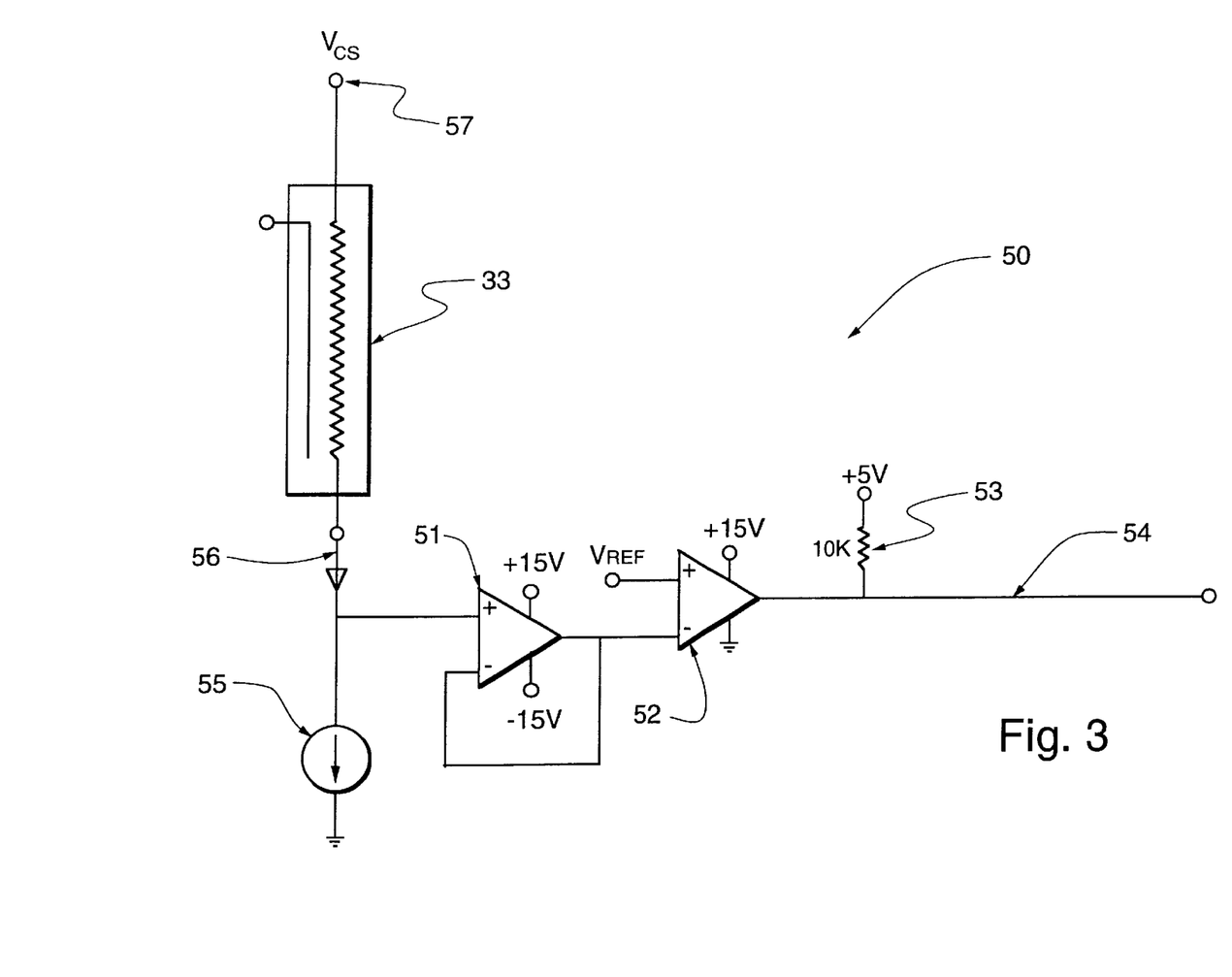
FIG. 3 shows an exemplary embodiment of the electromigration monitor circuitry of the present invention.

A preferred embodiment of an electromigration control and monitor circuit 50 is illustrated in FIG. 3. As previously described, the control and monitor circuit 50 is comprised of localized electronics paired with and communicating with a stress channel 12 used to stress a device under test. As shown in FIG. 3, a part of the device under test 33 is connected to a stress current source 55 or stress channel 12. In a preferred embodiment, the stress current 55 may be a constant current source generated by precision current source circuitry (not shown). A source voltage supply 57 ($V_{cs}$) is applied to the device under test 33. In a preferred embodiment, the control and monitor circuit 50 consists of an operational amplifier 51, a comparator 52, a resistor 53, and an electromigration sense point 54.

The non-inverting input of the operational amplifier 51 is connected between the device under test 33 and the stress current source 55. The inverting input of operational amplifier 51 is a feedback from the operational amplifier 51 output. The operational amplifier 51 output is also the input to the inverting input of comparator 52. The non-inverting input of comparator 52 is the limit reference voltage, $V_{REF}$, for that particular stress channel 12. The limit reference voltage, $V_{REF}$, is calculated as the source voltage minus the stress current 56 multiplied by the preselected limit reference resistance of that stress channel 12.

In a preferred embodiment, operational amplifier 51 may use power supply voltages of +/−15 volts, and comparator 52 may use power supply voltages of +15 volts and ground. The output of comparator 52 is the electromigration sense point 54. Between the electromigration sense point 54 and the operational amplifier output is a resistor 53 connected to a constant voltage source. In a preferred embodiment, as illustrated in FIG. 3, the resistor 53 may be set at 10,000 ohms and the voltage source may be 5 volts.

During a stress test with the monitor in operation, and a constant current applied to the device under test 33, the device resistance increases as a result of the stress being applied. The voltage across the device increases as the device resistance increases. If the voltage at node 56 decreases to a level below $V_{REF}$, the output of comparator 52 increases from zero volts to the value of the voltage source downstream from operational amplifier 52, or as shown in FIG. 3, 5 volts. This result occurs because operational amplifier 51 is a buffer, so the voltage at node 56 appears at the inverting input of comparator 52.

In the configuration and preferred embodiment shown in FIG. 3, when the electromigration limit is sensed by control and monitor circuit 50, the electromigration sense point 54 increases from 0 volts to 5 volts, or the voltage source downstream of the output of comparator 52. When this condition occurs, the stress current is automatically turned off. Moreover, with the transition at the electromigration sense point 54, status condition flags may be set in the master control card 25 which is observing the electromigration sense point 54. The status flags may then be later read by the controller 20. Therefore, although the controller 20 may not immediately sense that the device under stress has reached a limit reference voltage, the stress condition has been automatically shut down by the electromigration circuitry thereby maintaining the structural integrity of the device for later analysis.

As noted, the limit reference resistance may be programmable by changing the value of $V_{REF}$ through controller 20. A programmable limit offers enhanced flexibility during the testing as compared to the preselected and fixed limit.

Preferred Embodiment of Extrusion Control and Monitor Circuit

Figure 4:
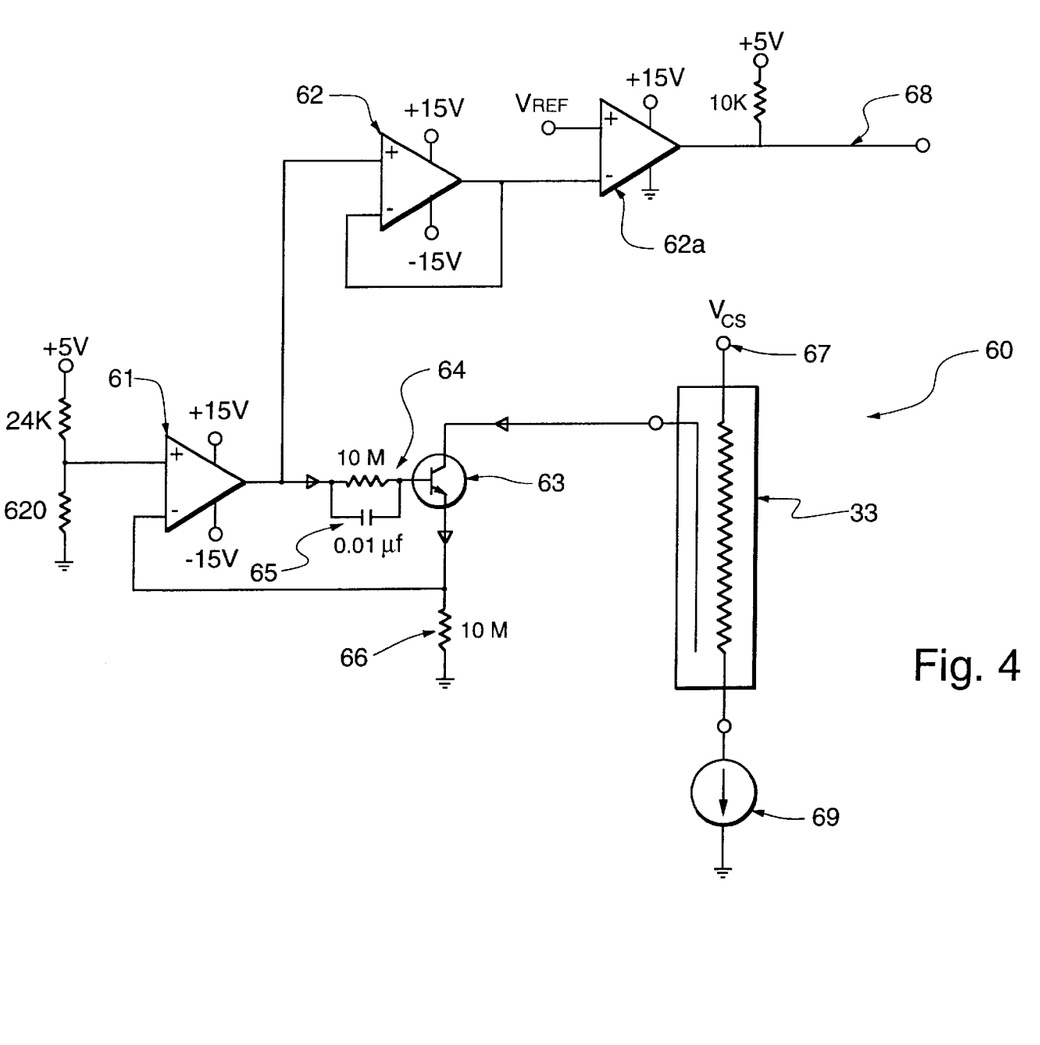
FIG. 4 shows an exemplary embodiment of the extrusion monitor with current limiting circuitry of the present invention.

A preferred embodiment of an extrusion monitor and control circuit 60 is illustrated in FIG. 4 with current limiting and a low voltage sense point. As previously described, the extrusion monitor and control circuit 60 is comprised of localized electronics paired with and communicating with a stress channel 12 that is used to stress a device under test 33. As shown in FIG. 4, a part of the device under test 33 is connected to a stress current 69 or stress channel 12. In a preferred embodiment, the stress current 69 may be a constant current source generated by precision current source circuitry (not shown). A source voltage supply 67 ($V_{cs}$) is also applied to the device under test 33. In a preferred embodiment, the extrusion monitor and control circuit 60 consists of two operational amplifiers 61 and 62, a resistor 64 connected in parallel with a capacitor 65 to a transistor 63, and an extrusion sense point 68.

The detailed circuitry of the extrusion control and monitor circuit 60 is as follows. The transistor 63 is connected to the device under test 33 such that the transistor 63 input or collector is connected to the device under test 33. The resistor 64 and the capacitor 65 arranged in parallel are connected to the base of the transistor 63. The output of operational amplifier 61 is connected to the other end of the in parallel resistor 64 and capacitor 65. The output or emitter of the transistor 63 is connected to the inverting input of operational amplifier 61. The output of transistor 63 also leads to ground through a resistor 66. In a preferred embodiment, operational amplifier 61 may use power supply voltages of +/−15 volts. The non-inverting input to operational amplifier 61 is connected to a voltage source through a resistor and to ground through another resistor. In the preferred embodiment illustrated in FIG. 4, the voltage source is 5 volts, the resistor connected between the voltage source and the op amp is 24,000 ohms, and the resistor connected between the ground and the op amp is 620 ohms.

The output of operational amplifier 61 is also connected to the noninverting input of operational amplifier 62. The inverting input of operational amplifier 62 is the output of operational amplifier 62 through a feedback loop. The output of operational amplifier 62 may also be the extrusion sense point 68 for the extrusion control and monitor circuit 60.

In another preferred embodiment, as shown in FIG. 4, that allows the extrusion sense point to be used by standard digital logic, operational amplifier 62 acts as a buffer and a comparator 62a may be included downstream of operational amplifier 62. Similar to the circuitry shown for the electromigration monitor in FIG. 3, the operational amplifier 62 output is the inverting input to comparator 62a. The non-inverting input of comparator 62a is the limit reference voltage, $V_{REF}$, for that particular stress channel 12. In a preferred embodiment as illustrated in FIG. 4, $V_{REF}$ may be set to 1.9 volts being the mid point of the voltage range of 2.4 volts and 1.4 volts. The output of comparator 62a is the extrusion sense point 68. In this embodiment, downstream of the comparator 62a output is a 10,000 ohm resistor and a voltage source of 5 volts, such that a 5 volt drop occurs at the extrusion sense point 68 when extrusion is observed in the device under test 33. The circuitry details of this voltage drop are further described below.

In a preferred embodiment, as illustrated in FIG. 4, with resistors 64 and 66 having values of 10,000,000 ohms, and capacitor 65 having a value of 0.01 microfarads, the extrusion control and monitor circuit 60 limits the extrusion current to 0.1 microamps. This value determines the reference or limit extrusion level for the stress test.

In this preferred embodiment, as illustrated in FIG. 4, with the extrusion control and monitor circuit 60 in operation, when the sensed extrusion current of the device under test 33 is less than 0.1 micro amps, the base current through resistor 64 is 0.1 micro amps plus the initial base current that existed through resistor 64. After extrusion, transistor 63 input current, or the extrusion current, is 0.1 micro amps. The extrusion control and monitor circuit 60 thereafter limits the extrusion current to that value regardless of the level of the source voltage supply 67. When the input current of the transistor 63 reaches this preselected level, the current through resistor 64 and into the base of transistor 63 drops to the initial current level that existed at resistor 64.

When the extrusion current level reaches the preset limit value, as determined by resistor 66 and the voltage input to operational amplifier 61, in the embodiment of FIG. 4, the extrusion control and monitor circuit 60 creates a 1 volt drop at the output of operational amplifier 62, or a drop from 2.4 volts to 1.4 volts. This voltage drop at the output of operational amplifier 62 and the corresponding 5 volt drop at the extrusion sense point 68 provides a signal that the limit extrusion current has been reached. Therefore, in this preferred embodiment of an extrusion control and monitor circuit 60 with current limiting and low voltage sensing, the extrusion control and monitor circuit 60 and its extrusion sense point 68 are protected from potentially high source voltage supply 67 values which may be input for the stress test.

The output of the extrusion sense point 68 may be used to set status condition flags in the master control card 25 to be read by the controller 20. As such, similar to the electromigration control and monitor circuit 50, although the controller 20 may not immediately sense when the device under test 33 reaches a limit extrusion current level, the stress condition has been automatically shut down by the extrusion control and monitor circuit 60. Such limiting of the extrusion current maintains the structural integrity of the device under test 33 for later analysis as well as the integrity of the extrusion control and monitor circuit 60.

The described and illustrated embodiment of an extrusion control and monitor circuit 60 provides a preselected limit extrusion current determined by the resistor 66 and the voltage input to operational amplifier 61. In another preferred embodiment, however, the limit extrusion current may be programmable by the user through the controller 20 and the master control card 25. Increased flexibility during stress testing will be available with the programmable capability, an advantage over the fixed, preselected value.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. An electrical stress and monitor system for electrically stressing an electrical device, comprising:

a plurality of stress channels for stressing the electrical device; and a plurality of control and monitor circuits, each of the control and monitor circuits being paired with one of the plurality of stress channels, having a predefined limit stress level, and communicating with and controlling the paired stress channel such that, if a control and monitor circuit senses a stress level at the predefined limit stress level, the control and monitor circuit electronically shuts down the paired stress channel.

2. The stress and monitor system as provided in claim 1, further comprising:

a control bus communicating with each of the paired stress channels and control and monitor circuits;

status and enabling means communicating with the paired stress channels and control and monitor circuits through the control bus, the status and enabling means for (1) determining the status of the stress channels, (2) controlling the stress input, and (3) enabling and disabling the control and monitor circuits; and a computer communicating with the status and enabling means through a serial interface.

3. The stress and monitor system as provided in claim 1, wherein the plurality of control and monitor circuits comprise at least an electromigration monitor to monitor and limit the electromigration stress of the electrical device under test.

4. The stress and monitor system, as provided in claim 1, wherein the plurality of control and monitor circuits comprise at least an extrusion monitor to monitor and limit the extrusion stress of the electrical device under test.

5. A high-temperature, constant-current stress and monitor system for electrically stressing an electrical circuit, comprising:

a plurality of stress channels;

a plurality of control and monitor circuits, each of the control and monitor circuits being paired with one of the plurality of stress channels and communicating with and controlling the plurality of stress channels such that, if a control and monitor circuit senses a limiting stress level, the control and monitor circuit shuts down the paired stress channel;

a control bus communicating with each of the paired stress channels and control and monitor circuits;

status and enabling means communicating with the paired stress channels and control and monitor circuits through the control bus, the status and enabling means for (1) determining the status of the stress channel, (2) controlling the stress input and (3) enabling and disabling the control and monitor circuits;

a computer communicating with the status and enabling means through a serial interface; and a plurality of analog multiplexers for reading the voltage states of the control and monitor circuits.

6. The high-temperature, constant-current stress and monitor system as provided in claim 5, wherein the plurality of control and monitor circuits comprise at least an electromigration monitor to monitor and limit the electromigration stress of the electrical circuit under test.

7. The high-temperature, constant-current stress and monitor system as provided in claim 6, wherein the electromigration monitor further comprises a programmable reference limit voltage.

8. The high-temperature, constant-current stress and monitor system as provided in claim 5, wherein the plurality of control and monitor circuits comprise at least an extrusion monitor to monitor and limit the extrusion stress of the electrical circuit under test.

9. The high-temperature, constant-current stress and monitor system as provided in claim 8, wherein the extrusion monitor further comprises a programmable reference limit current.

10. The high-temperature, constant-current stress and monitor system as provided in claim 5, wherein the plurality of control and monitor circuits comprise at least a temperature monitor to monitor and limit the temperature stress of the electrical circuit under test.

11. The high-temperature, constant-current stress and monitor system as provided in claim 5, wherein the plurality of control and monitor circuits include at least a rate of electromigration monitor to monitor and limit the rate of electromigration stress of the electrical circuit under test.

12. The high-temperature, constant-current stress and monitor system as provided in claim 5, wherein the plurality of control and monitor circuits include at least a rate of extrusion monitor to monitor and limit the rate of extrusion stress of the electrical circuit under test.

13. The high-temperature, constant-current stress and monitor system as provided in claim 5, wherein the status and enabling means is a microprocessor.

14. A high-temperature, constant-current stress and monitor system for electrically stressing an electrical circuit, comprising:

a plurality of stress channels;

a plurality of control and monitor circuits, each of the control and monitor circuits (1) being paired with one of the plurality of stress channels, (2) communicating with and controlling the plurality of stress channels such that, if a control and monitor circuit senses a limiting stress level, the control and monitor circuit shuts down the paired stress channel, and (3) including at least one of an electromigration monitor to monitor and limit the electromigration stress of the electrical circuit under test and an extrusion monitor to monitor and limit the extrusion stress of the electrical circuit under test;

a plurality of analog multiplexers for reading one of the voltage states and the current states of the control and monitor circuits;

a control bus communicating with each of the paired stress channels and control and monitor circuits;

status and enabling means communicating with the paired stress channels and control and monitor circuits through the control bus, the status and enabling means for (1) determining the status of the stress channel, (2) controlling the stress input and (3) enabling and disabling the control and monitor circuits; and a computer communicating with the status and enabling means through a serial interface.

15. The high-temperature, constant-current stress and monitor system as provided in claim 14, wherein the plurality of control and monitor circuits comprise at least a temperature monitor to monitor and limit the temperature stress of the electrical circuit under test.

16. The high-temperature, constant-current stress and monitor system as provided in claim 14, wherein the plurality of control and monitor circuits include at least a rate of electromigration monitor to monitor and limit the rate of electromigration stress of the electrical circuit under test.

17. The high-temperature, constant-current stress and monitor system as provided in claim 14, wherein the plurality of control and monitor circuits include at least a rate of extrusion monitor to monitor and limit the rate of extrusion stress of the electrical circuit under test.

18. The high-temperature, constant-current stress and monitor system as provided in claim 14, wherein the status and enabling means is a microprocessor.

19. The high-temperature, constant-current stress and monitor system as provided in claim 14, wherein each of the control and monitor circuits includes an electromigration monitor having a programmable reference limit voltage.

20. The high-temperature, constant-current stress and monitor system as provided in claim 16, wherein each of the control and monitor circuits includes an extrusion monitor having a programmable reference limit current.

21. A high-temperature, constant-current stress and monitor system for electrically stressing an electrical circuit, comprising:

a plurality of stress channels;

a plurality of control and monitor circuits, each of the control and monitor circuits being paired with one of the plurality of stress channels and communicating with and controlling the plurality of stress channels such that, if a control and monitor circuit senses a limiting stress level, the control and monitor circuit shuts down the paired stress channel;

a control bus communicating with each of the paired stress channels and control and monitor circuits;

status and enabling means communicating with the paired stress channels and control and monitor circuits through the control bus, the status and enabling means for (1) determining the status of the stress channel, (2) controlling the stress input and (3) enabling and disabling the control and monitor circuits;

a computer communicating with the status and enabling means through a serial interface; and a plurality of analog multiplexers for reading the current states of the control and monitor circuits.

22. The high-temperature, constant-current stress and monitor system as provided in claim 21, wherein the plurality of control and monitor circuits comprise at least an electromigration monitor to monitor and limit the electromigration stress of the electrical circuit under test.

23. The high-temperature, constant-current stress and monitor system as provided in claim 22, wherein the electromigration monitor further comprises a programmable reference limit voltage.

24. The high-temperature, constant-current stress and monitor system as provided in claim 21, wherein the plurality of control and monitor circuits comprise at least an extrusion monitor to monitor and limit the extrusion stress of the electrical circuit under test.

25. The high-temperature, constant-current stress and monitor system as provided in claim 24, wherein the extrusion monitor further comprises a programmable reference limit current.

26. The high-temperature, constant-current stress and monitor system as provided in claim 21, wherein the plurality of control and monitor circuits comprise at least a temperature monitor to monitor and limit the temperature stress of the electrical circuit under test.

27. The high-temperature, constant-current stress and monitor system as provided in claim 21, wherein the plurality of control and monitor circuits include at least a rate of electromigration monitor to monitor and limit the rate of electromigration stress of the electrical circuit under test.

28. The high-temperature, constant-current stress and monitor system as provided in claim 21, wherein the plurality of control and monitor circuits include at least a rate of extrusion monitor to monitor and limit the rate of extrusion stress of the electrical circuit under test.

29. The high-temperature, constant-current stress and monitor system as provided in claim 21, wherein the status and enabling means is a microprocessor.

* * * * *